United States Patent
Adachi

(10) Patent No.: US 7,400,148 B2
(45) Date of Patent: Jul. 15, 2008

(54) MRI APPARATUS, SIGNAL SELECTION METHOD IN MRI APPARATUS, AND MRI METHOD IN MAGNETIC RESONANCE IMAGING APPARATUS

(75) Inventor: Kohei Adachi, Nasushiobara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 11/386,771

(22) Filed: Mar. 23, 2006

(65) Prior Publication Data

US 2006/0214662 A1    Sep. 28, 2006

(30) Foreign Application Priority Data

Mar. 23, 2005    (JP)    ............................. 2005-084122

(51) Int. Cl.
*G01V 3/00*    (2006.01)
(52) U.S. Cl. ...................................... 324/322; 324/318
(58) Field of Classification Search ................. 324/322, 324/318
See application file for complete search history.

(56) References Cited

U.S. PATENT DOCUMENTS 5,248,943 A * 9/1993 Fox et al. ..................... 324/322
5,280,246 A   1/1994 Takahashi et al.

FOREIGN PATENT DOCUMENTS

| JP | 5-7570 | 1/1993 |
| JP | 5-42125 | 2/1993 |
| JP | 6-105824 | 4/1994 |
| JP | 2002-143122 | 5/2002 |

* cited by examiner

*Primary Examiner*—Louis M Arana
(74) *Attorney, Agent, or Firm*—Nixon & Vanderhye PC

(57) ABSTRACT

A magnetic resonance imaging includes: a first converter that converts some of the magnetic resonance signals, to be processed, corresponding to a plurality of channels into signals corresponding to a plurality of effective channels set within a first frequency band and converts magnetic resonance signals corresponding to other channels into signals corresponding to channels set within a second frequency band different from the first frequency band; a synthesizer that synthesizes the channel-converted signals; an extractor that extracts a signal included in the first frequency band from the synthesized signals; and a divider that divides the extracted signal into magnetic resonance signals corresponding to the plurality of effective channels.

22 Claims, 5 Drawing Sheets

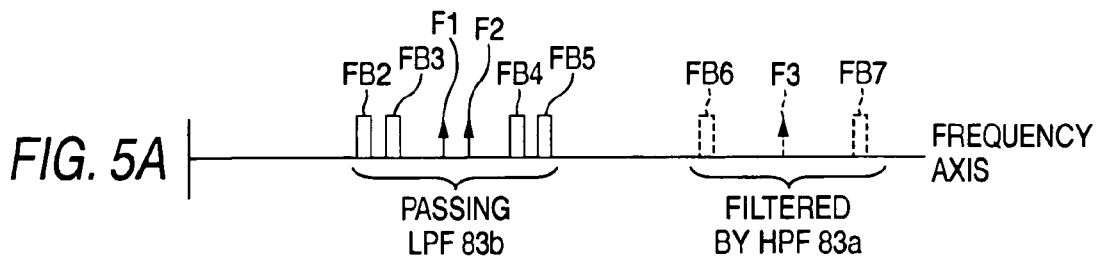
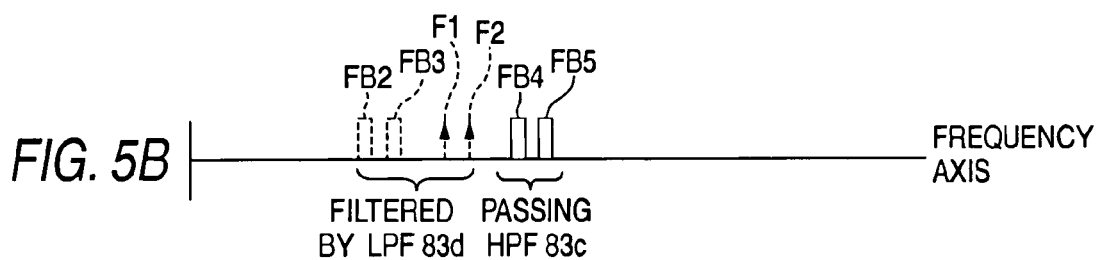
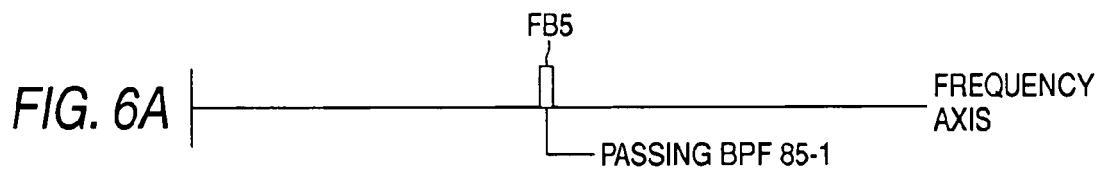
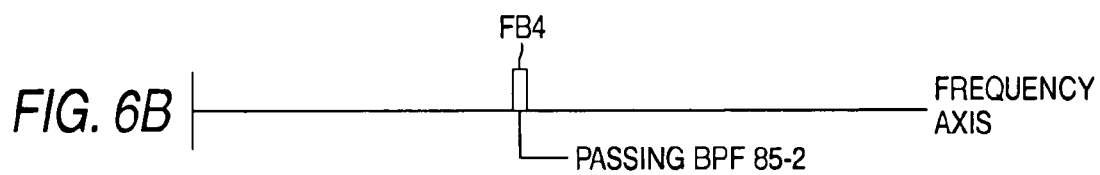

MRI APPARATUS, SIGNAL SELECTION METHOD IN MRI APPARATUS, AND MRI METHOD IN MAGNETIC RESONANCE IMAGING APPARATUS

CROSS-REFERENCE TO RELATED APPLICATIONS

This application is based upon and claims the benefit of priority from prior Japanese Patent Application No. 2005-084122, filed Mar. 23, 2005, the entire contents of which are incorporated herein by reference.

BACKGROUND OF THE INVENTION

1. Field of the Invention

The present invention relates to a magnetic resonance imaging apparatus in which a high frequency receiving coil includes a plurality of coil elements or the high frequency receiving coil can be mounted with the plurality of coil elements, a signal selection method in the magnetic resonance imaging apparatus, and a magnetic resonance imaging method in the magnetic resonance imaging apparatus.

2. Description of the Related Art

In recent years, a magnetic resonance imaging apparatus can utilize various types of high frequency receiving coils according to the purpose. In some of the high frequency receiving coils, a plurality of coil elements is arranged. In addition, some of the high frequency receiving coils is also provided with, for example, local coils corresponding to different picture portions.

As such, the magnetic resonance imaging apparatus is configured such that a plurality of coil elements arranged in a high frequency receiving coil or a plurality of kinds of high frequency receiving coils is connected in parallel, and the number of coil elements or high frequency receiving coils is increasing. For example, there is a magnetic resonance imaging apparatus in which 128 coil elements can be connected in parallel.

In such magnetic resonance imaging apparatus, a technique of transmitting output signals of a plurality of coil elements in a frequency-multiplexing manner is disclosed in JP-A-2002-143122, for example.

On the other hand, all of the coil elements connected in parallel are not used at the same time. Therefore, the number of processing systems for processing the output signals from the coil elements is set to be less than the number of coil elements which can be connected to one another. For example, 32 processing systems are prepared for the 128 coil elements.

In this case, since an output signal from a coil element to be used needs to be selectively input to a corresponding processing system but the number of combinations of the coil elements and the processing systems is large, a selection circuit becomes very complicated. A matrix switch is generally used for the selection circuit. The matrix switch needs to have a matrix of sxs in order to freely select some of the 's' coil elements. When the selection circuit is formed by connecting a plurality of matrix switches to one another, each having a matrix of qxq (q<<s), in a multiple stage, the size of the selection circuit becomes smaller than that of a matrix switch having a matrix of sxs. However, in this case described above, the number of combinations of selectable coil elements is limited. This causes a problem in convenience.

BRIEF SUMMARY OF THE INVENTION

For this reason, it has been required to freely select and use a predetermined coil element.

According to a first aspect of the invention, a magnetic resonance imaging apparatus of processing and imaging some of magnetic resonance signals corresponding to a plurality of channels includes: a first converter that converts some of the magnetic resonance signals, to be processed, corresponding to the plurality of channels into signals corresponding to a plurality of effective channels set within a first frequency band and converts magnetic resonance signals corresponding to other channels into signals corresponding to channels set within a second frequency band different from the first frequency band; a synthesizer that synthesizes the channel-converted signals; an extractor that extracts a signal included in the first frequency band from the synthesized signals; and a divider that divides the extracted signal into magnetic resonance signals corresponding to the plurality of effective channels.

Further, according to a second aspect of the invention, a magnetic resonance imaging apparatus of processing and imaging some of magnetic resonance signals corresponding to a plurality of channels includes: a first converter that converts some of the magnetic resonance signals, to be processed, corresponding to the plurality of channels into signals corresponding to a plurality of effective channels set within a first frequency band and converts magnetic resonance signals corresponding to other channels into signals corresponding to channels set within a second frequency band different from the first frequency band; a synthesizer that synthesizes the channel-converted signals; and a reconstruction unit that reconstructs an image on the basis of a signal, included in the first frequency band, of the synthesized signals.

Furthermore, according to a third aspect of the invention, a signal selection method in a magnetic resonance imaging apparatus of processing and imaging some of magnetic resonance signals corresponding to a plurality of channels includes: converting some of the magnetic resonance signals, to be processed, corresponding to the plurality of channels into signals corresponding to a plurality of effective channels set within a first frequency band and converting magnetic resonance signals corresponding to other channels into signals corresponding to channels set within a second frequency band different from the first frequency band; synthesizing the channel-converted signals; extracting a signal included in the first frequency band from the synthesized signals; and dividing the extracted signal into magnetic resonance signals corresponding to the plurality of effective channels.

In addition, according to a fourth aspect of the invention, a magnetic resonance imaging method of processing and imaging some of magnetic resonance signals corresponding to a plurality of channels includes: converting some of the magnetic resonance signals, to be processed, corresponding to the plurality of channels into signals corresponding to a plurality of effective channels set within a first frequency band and converting magnetic resonance signals corresponding to other channels into signals corresponding to channels set within a second frequency band different from the first frequency band; synthesizing the channel-converted signals; and reconstructing an image on the basis of a signal, included in the first frequency band, of the synthesized signals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specifications, illustrate presently preferred embodiments of the invention, and together with the general description given above and the detailed description of the preferred embodiments given below, serve to explain the principles of the invention.

FIG. 5A is a view explaining an operation of a diplexer shown in FIG. 2;

FIG. 5B is a view explaining an operation of a diplexer shown in FIG. 2;

FIG. 6A is a view explaining an operation of a BPF shown in FIG. 2;

FIG. 6B is a view explaining an operation of a diplexer shown in FIG. 2;

FIG. 7A is a view illustrating a band distribution of a signal output from the diplexer shown in FIG. 2;

FIG. 7B is a view illustrating a band distribution of a signal output from the diplexer shown in FIG. 2.

DESCRIPTION OF THE PREFERRED EMBODIMENTS

Hereinafter, an embodiment of the invention will be described with reference to the accompanying drawings.

Figure 1:
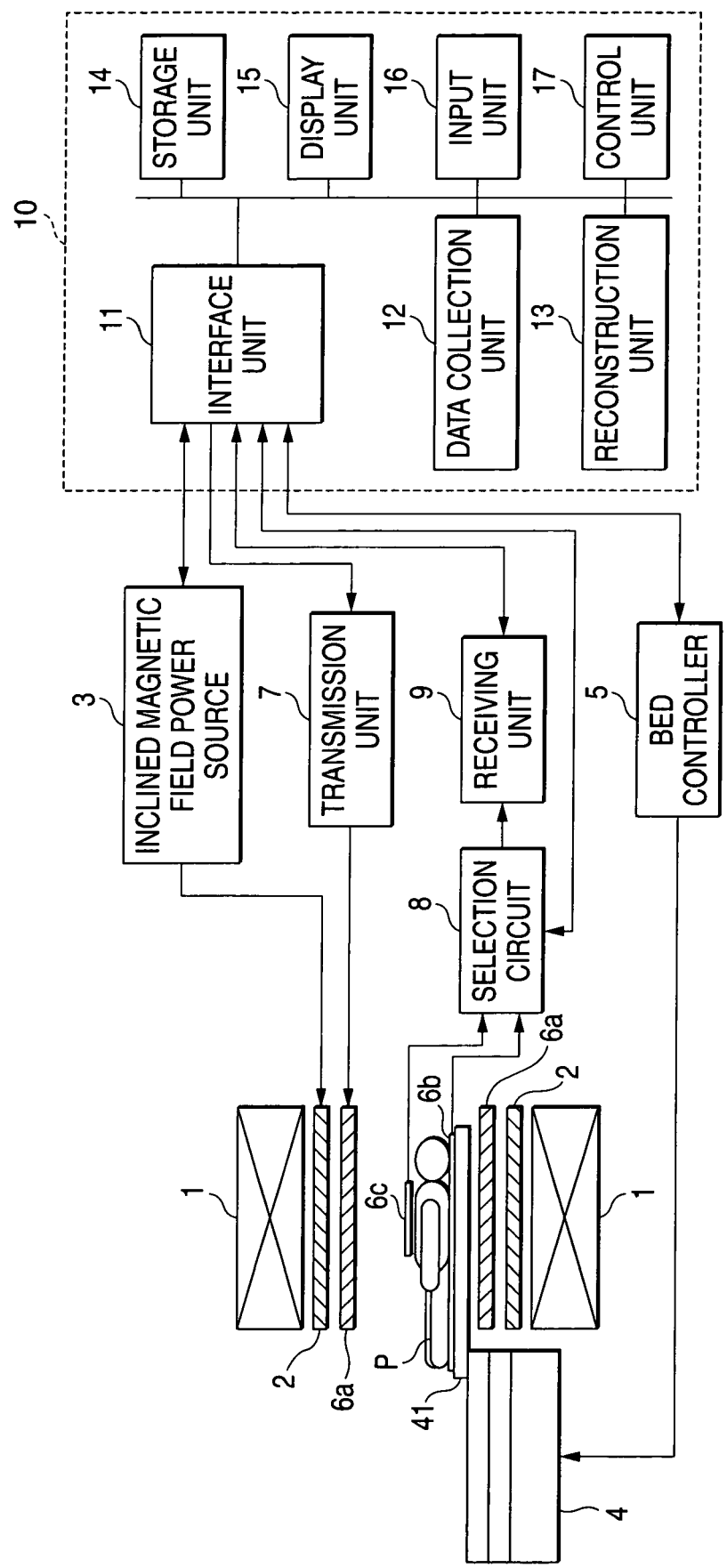
FIG. 1 is a view illustrating the configuration of a magnetic resonance imaging apparatus (MRI apparatus) according to an embodiment of the invention.

FIG. 1 is a view illustrating the configuration of a magnetic resonance imaging apparatus (MRI apparatus) according to the embodiment. The MRI apparatus shown in FIG. 1 includes a magnetostatic field magnet 1, an inclined magnetic field coil 2, an inclined magnetic field power source 3, a bed 4, a bed controller 5, RF coil units 6a, 6b, and 6c, a transmission unit 7, a selection circuit 8, a receiving unit 9, and a calculator system 10.

The magnetostatic field magnet 1 has a hollow cylindrical shape and generates a uniform magnetostatic field thereinside. For example, a permanent magnet or a superconducting magnet is used as the magnetostatic field magnet 1.

The inclined magnetic field coil 2 has a hollow cylindrical shape and is disposed inside the magnetostatic field magnet 1. The inclined magnetic field coil 2 is formed by a combination of three kinds of coils corresponding to respective axes of X, Y, and Z which are perpendicular to one another. In the inclined magnetic field coil 2, each of the three kinds of coils is individually supplied with a current from the inclined magnetic field power source 3. Thereby, the inclined magnetic field coil 2 generates an inclined magnetic field of which a magnetic field intensity is inclined along each of the axes of X, Y, and Z. Here, for example, the Z axis direction is assumed to be the same direction as the magnetostatic field. For example, inclined magnetic fields corresponding to the axes X, Y, and Z correspond to, an inclined magnetic field Gs for slice selection, an inclined magnetic field Ge for phase encoding, and an inclined magnetic field Gr for readout, respectively. The inclined magnetic field Gs for slice selection is used to arbitrarily determine a cross-sectional surface to be photographed. The inclined magnetic field Ge for phase encoding is used to vary the phase of a magnetic resonance signal according to a spatial position. The inclined magnetic field Gr for readout is used to vary the frequency of the magnetic resonance signal according to the spatial position.

A patient's body P is inserted into an enclosed space of the inclined magnetic field coil 2 in a state in which the patient's body P is placed on a top plate 41 of the bed 4. The bed 4 is driven by the bed controller 5, and the top plate 41 moves in the longitudinal direction (left and right direction in FIG. 1) and in the up and down direction thereof. In general, the bed 4 is disposed such that the longitudinal direction is parallel to a central axis of the magnetostatic field magnet 1.

The RF coil unit 6a is formed by accommodating one or a plurality of coils within a cylindrical case. The RF coil unit 6a is disposed inside the inclined magnetic field coil 2. In addition, the RF coil unit 6a is supplied with a high frequency pulse (RF pulse) from the transmission unit 7 so as to generate a high frequency magnetic field.

The RF coil units 6b and 6c are placed on the top plate 41, are included in the top plate 41, or are mounted on the patient's body P. At the time of photographing, the RF coil units 6b and 6c are placed in the enclosed space of the inlined magnetic filed coil together with the patient's body P. In addition, each of the RF coil units 6b and 6c includes at least a coil element. The coil element included in each of the RF coil units 6b and 6c receives a magnetic resonance signal radiated from the patient's body P. An output signal of each coil element is individually input to the selection circuit 8. A receiving RF coil unit is not limited to the RF coil units 6b and 6c, but various types of RF coil units may be used. In addition, one receiving RF coil unit or three or more receiving RF coil units may be used. In the description below, the number of coil elements which can be simultaneously connected to the selection circuit 8 is denoted by m. The 'm' is 128, for example.

The transmission unit 7 has an oscillation unit, a phase selection unit, a frequency conversion unit, an amplitude modulation unit, and a high frequency power amplification unit. The oscillation unit generates a high frequency signal having an inherent resonance frequency with respect to a targeted nucleus in the magnetostatic field. The phase selection unit selects the phase of the high frequency signal. The frequency conversion unit converts the frequency of the high frequency signal output from the phase selection unit. The amplitude modulation unit modulates the amplitude of the high frequency signal output from the frequency conversion unit according to, for example, a sinc function. The high frequency power amplification unit amplifies the high frequency signal output from the amplitude modulation unit. In addition, as a result of operations of the oscillation unit, the phase selection unit, the frequency conversion unit, an amplitude modulation unit, and the high frequency power amplification unit, the transmission unit 7 supplies an RF pulse, which corresponds to Larmor frequency, to the RF coil unit 6a.

The selection circuit 8 selects predetermined one channel to n channel magnetic resonance signals from m or less channel magnetic resonance signals output from the RF coil units 6b and 6c. Here, n is a positive number smaller than m, and for example, n is 32. In addition, the selection circuit 8 sends selected magnetic resonance signals to the receiving unit 9. With respect to which channel is to be selected, an instruction is given from a calculator system 10.

The receiving unit 9 includes n channel processing systems each having a pre-stage amplifier, a phase detector, and an A/D converter. The n channel processing systems are input with n or less channel magnetic resonance signals selected by the selection circuit 8, respectively. The pre-stage amplifier amplifies the magnetic resonance signals. The phase detector detects the phase of the magnetic resonance signal output from the pre-stage amplifier. The A/D converter converts the signal output from the phase detector into a digital signal. The receiving unit 9 outputs n or less channel digital signals which are obtained by the respective processing systems.

The calculator system 10 includes an interface unit 11, a data collection unit 12, a reconstruction unit 13, a storage unit 14, a display unit 15, an input unit 16, and a control unit 17.

The interface unit 11 is connected with the inclined magnetic field power source 3, the bed controller 5, the transmission unit 7, the receiving unit 9, and the selection circuit 8. The interface unit 11 performs input and output operations with respect to signals between the calculator system 10 and each of the inclined magnetic field power source 3, the bed controller 5, the transmission unit 7, the receiving unit 9, and the selection circuit 8.

The data collection unit 12 collects a digital signal output from the receiving unit 9. The data collection unit 12 stores the collected digital signal, that is, magnetic resonance signal data in the storage unit 14.

The reconstruction unit 13 performs a post-process, that is, a reconstruction, such as Fourier transformation, with respect to the magnetic resonance signal data stored in the storage unit 14, and obtains spectrum data or image data with respect to a desired nuclear spin within the patient's body P.

The storage unit 14 stores the magnetic resonance signal data and the spectrum data or the image data for each patient.

The display unit 15 displays various information, such as spectrum data or image data, under the control of the control unit 17. A display device, such as a liquid crystal display device, can be used as the display unit 15.

The input unit 16 is input with various instructions or information from an operator. As the input unit 16, it is possible to properly use a pointing device such as a mouse or a track ball, a selection device such as a mode change switch, or an input device such as a keyboard.

The control unit 17 has a CPU (not shown) or a memory and collectively controls the MRI apparatus of the present embodiment.

Figure 2:
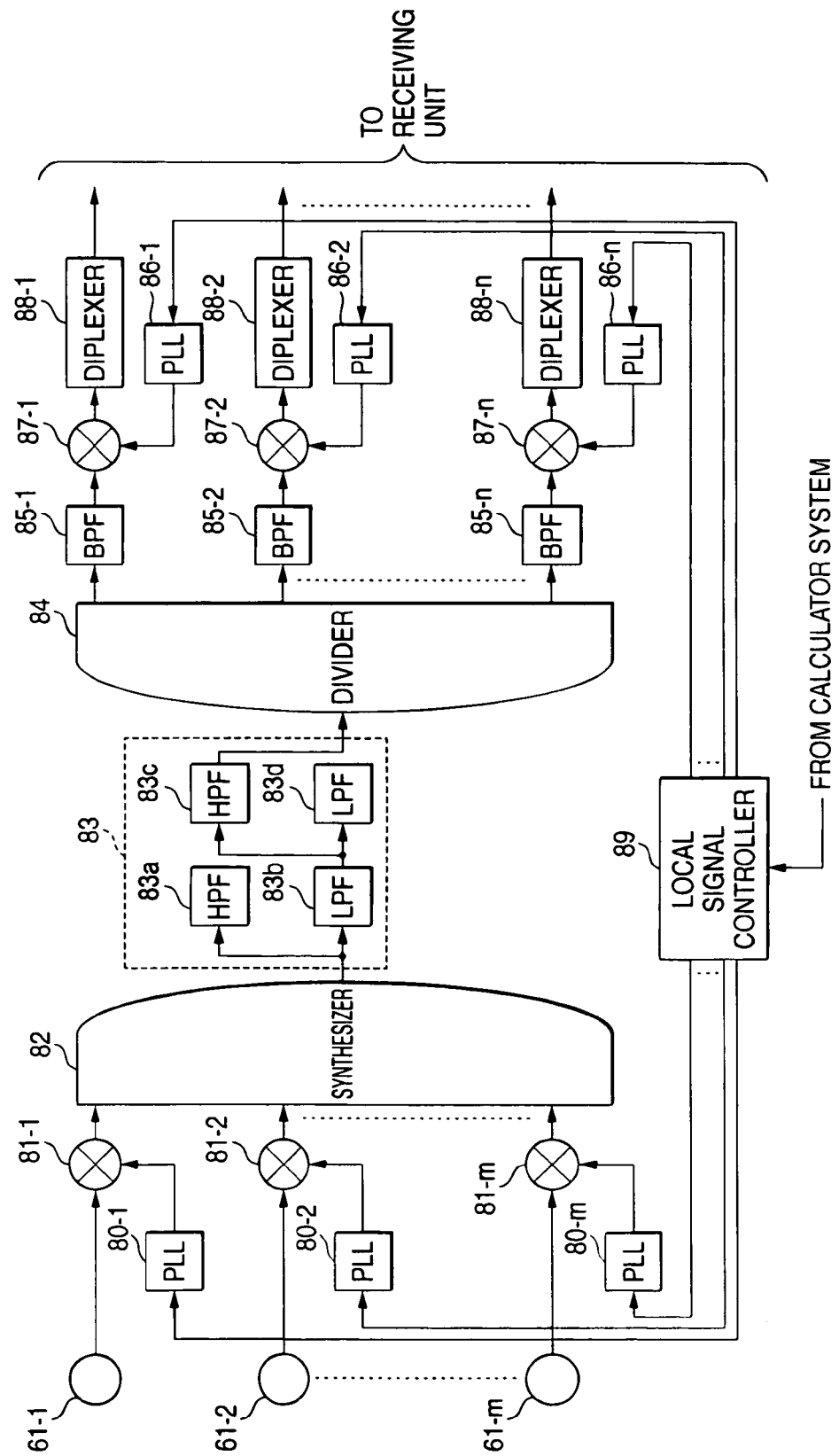
FIG. 2 is a block diagram illustrating an example of a detailed configuration of a selection circuit shown in FIG. 1.

FIG. 2 is a block diagram illustrating an example of a detailed configuration of the selection circuit 8 shown in FIG. 1.

As shown in FIG. 2, the selection circuit 8 includes phase locked loops (PLL) 80-1, 80-2, . . . , and 80-$m$, mixers 81-1, 81-2, . . . , and 81-$m$, a synthesizer 82, diplexer 83, a divider 84, band pass filters (BPF) 85-1, 85-2, . . . , and 85-$n$, PLLs 86-1, 86-2, . . . , and 86-$n$, mixers 87-1, 87-2, . . . , and 87-$n$, diplexers 88-1, 88-2, . . . , and 88-$n$, and a local signal controller 89.

Figure 3:
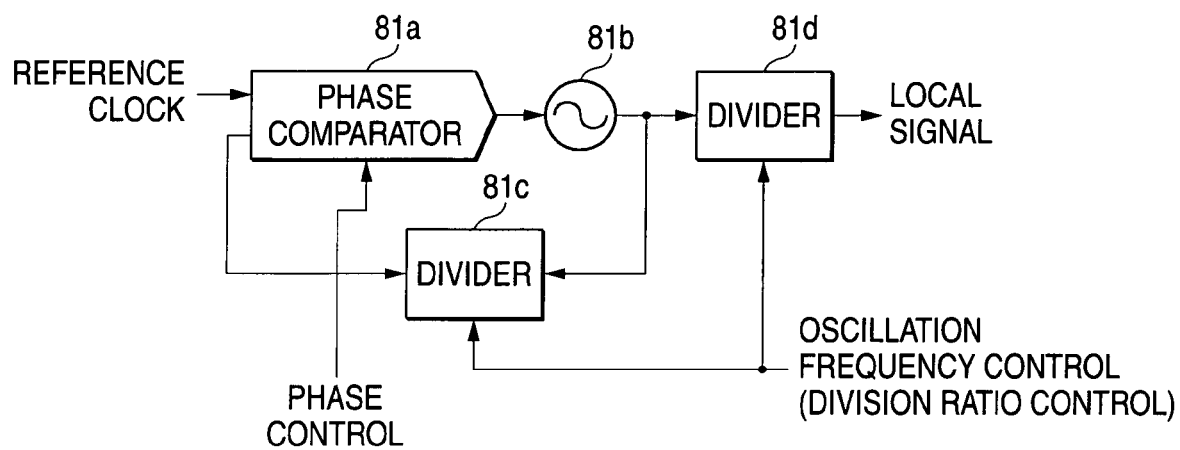
FIG. 3 is a block diagram illustrating an example of a detailed configuration of a PLL shown in FIG. 2.

As shown in FIG. 3, each of the PLLs 80-1, 80-2, . . . , and 80-$m$ has a known configuration including a phase comparator 81$a$, a voltage controlled oscillator 81$b$, and dividers 81$c$ and 81$d$. In addition, each of the PLLs 80-1, 80-2, . . . , and 80-$m$ generates a local signal having a frequency and a phase individually instructed from the local signal controller 89.

The mixers 81-1, 81-2, . . . , and 81-$m$ are input with magnetic resonance signals output from m coil elements 61-1, 61-2, and 61-$m$, respectively. In addition, the mixers 81-1, 81-2, . . . , and 81-$m$ are input with the local signals generated by the PLLs 80-1, 80-2, . . . , and 80-$m$, respectively. In addition, each of the mixers 81-1, 81-2, . . . , and 81-$m$ mixes each of the output signals of the coil elements 61-1, 61-2, . . . , and 61-$m$ with each of the local signals generated by the PLLs 80-1, 80-2, . . . , and 80-$m$.

The synthesizer 82 synthesizes all of the output signals of the mixers 81-1, 81-2, . . . , and 81-$m$, thereby obtaining one-system signal.

The diplexer 83 includes high pass filters (HPF) 83$a$ and 83$c$ and low pass filters (LPF) 83$b$ and 83$d$. The diplexer 83 extracts a specific frequency band in an output signal of the synthesizer 82.

The divider 84 divides an output signal of the diplexer 83 into n channels.

The n channel divided signals are input to the BPFs 85-1, 85-2, . . . , and 85-$n$, respectively. The BPFs 85-1, 85-2, . . . , and 85-$n$ extract different frequency bands from input signals, respectively.

As shown in FIG. 3, each of the PLLs 86-1, 86-2, . . . , and 86-$n$ has a known configuration including the phase comparator 81$a$, the voltage controlled oscillator 81$b$, and the dividers 81$c$ and 81$d$. In addition, each of the PLLs 86-1, 86-2, . . . , and 86-$n$ generates a local signal having a frequency and a phase individually instructed from the local signal controller 89.

Output signals of the BPFs 85-1, 85-2, . . . , and 85-$n$ are respectively input to the mixers 87-1, 87-2, . . . , and 87-$n$. Local signals generated by the PLLs 86-1, 86-2, . . . , and 86-$n$ are input to the mixers 87-1, 87-2, . . . , and respectively. Each of the mixers 87-1, 87-2, . . . , and 87-$n$ mixes each of the output signals of the BPFs 85-1, 85-2, . . . , and 85-$n$ with each of the local signals generated by the PLLs 86-1, 86-2, . . . , and 86-$n$.

Each of the diplexers 88-1, 88-2, . . . , and 88-$n$ extracts a specific frequency band in an output signal of each of the mixers 87-1, 87-2, . . . , and 87-$n$.

The local signal controller 89 supplies a common reference clock to the PLLs 80-1, 80-2, . . . , and 80-$m$ and the PLLs 86-1, 86-2, . . . , and 86-$n$. The local signal controller 89 controls a frequency and a phase of each of the local signals generated by the PLLs 80-1, 80-2, . . . , and 80-$m$ on the basis of a selection channel instructed from the calculator system 10. The local signal controller 89 controls the frequency of each of the local signals generated by the PLLs 86-1, 86-2, . . . , and 86-$n$ according to a channel to which each of the PLLs 86-1, 86-2, . . . , and 86-$n$ belongs.

Next, an operation of the MRI apparatus constructed as above will be described. In addition, an operation of obtaining an image of the patient's body P is the same as in the related art, and therefore, an explanation thereof will be omitted. In addition, an explanation below will be focused on an operation related to the selection of a magnetic resonance signal.

The number m of channels and the number n of channels are large numbers, such as '128' and '32', as described above; however, the number m of channels and the number n of channels are respectively set to '3' and '2' for the simplicity of explanation. In addition, it is assumed that three input-side channels of the selection circuit 8 are first to third receiving channels, and two output-side channels of the selection circuit 8 are first and second processing channels. In addition, it will be described about a case in which the first and second receiving channels are objects to be selected.

From the coil elements 61-1, 61-2, and 61-3, magnetic resonance signals in the same frequency band (hereinafter, referred to as 'first frequency band') are output, respectively. Each of the magnetic resonance signals is mixed with a local signal by each of the mixers 81-1, 81-2, and 81-3, and thus a frequency conversion (up conversion) with respect to each of the magnetic resonance signals is performed.

Then, the local signal controller 89 controls oscillation frequencies of the PLLs 80-1 and 80-2 belonging to the first and second receiving channels, which are objects to be selected, and converts frequency bands of magnetic resonance signals of the first and second receiving channels into different frequency bands within a second frequency band. In addition, the local signal controller 89 controls an oscillation frequency of the PLL 80-3 belonging to the third receiving channel, which is not an object to be selected, and converts a frequency band of a magnetic resonance signal of the third receiving channel into a predetermined frequency band higher than the second frequency band.

Figure 4:
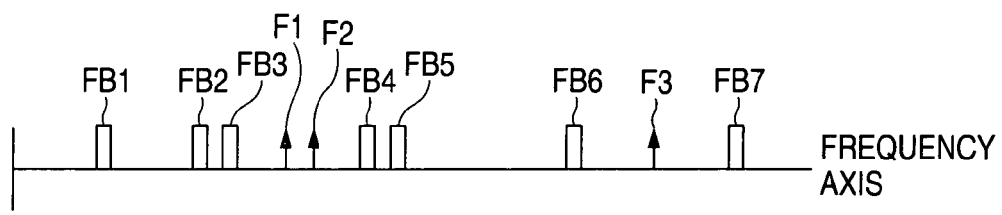
FIG. 4 is a view illustrating a band distribution of each signal.

FIG. 4 is a view illustrating a band distribution of each signal.

The first frequency band is denoted by reference numeral FB1. The oscillation frequencies of the PLLs 80-1, 80-2, and 80-3 are denoted by reference numerals F1, F2, and F3, respectively. In addition, frequency bands of the magnetic resonance signals of the first to third receiving channels, which have been subjected to a frequency conversion process, are denoted by reference numerals FB4, FB5, and FB7, respectively. In addition, reference numerals FB2, FB3, and FB6 denote frequency bands of an image signal generated at a time of a frequency conversion.

When the output signals of the mixers 81-1, 81-2, and 81-3 are synthesized by the synthesizer 82, it is possible to obtain a signal having a signal component of a frequency and a frequency band other than the first frequency band FB1 shown in FIG. 4, and the signal is input to the diplexer 83.

In the diplexer 83, first, as shown in FIG. 5A, the magnetic resonance signals, the local signals, and the image signals of the first and second receiving channels pass through the LPF 83b, the magnetic resonance signal, the local signal, and the image signal of the third receiving channels are filtered by the HPF 83a. Then, in the diplexer 83, as shown in FIG. 5B, the magnetic resonance signals of the first and second receiving channels pass through the HPF 83c, and the local signals and the image signals of the first and second receiving channels are filtered by the LPF 83d. Thereby, in the diplexer 83, a magnetic resonance signal within the second frequency band, that is, only magnetic resonance signals of the first and second receiving channels are extracted.

As such, a signal including only the magnetic resonance signals of the first and second receiving channels is divided by the divider 84 to be input to the BPFs 85-1 and 85-2. The BPF 85-1 passes only the frequency band FB5, as shown in FIG. 6A. That is, only the magnetic resonance signal of the second receiving channel is extracted. On the other hand, the BPF 85-2 passes only the frequency band FB4, as shown in FIG. 6B. That is, only the magnetic resonance signal of the first receiving channel is extracted.

An output signal of the BPF 85-1 is frequency-converted (down conversion) into a signal included in the third frequency band by the PLL 86-1 and the mixer 87-1, and then only the third frequency band is extracted to the diplexer 88-1. Thereby, a signal as shown in FIG. 7A, which includes the magnetic resonance signal of the second receiving channel in a third frequency band FB8, is output from the diplexer 88-1. An output signal of the BPF 85-2 is frequency-converted (down conversion) into a signal included in the third frequency band by the PLL 86-2 and the mixer 87-2, and then only the third frequency band is extracted to the diplexer 88-2. Thereby, a signal as shown in FIG. 7B, which includes the magnetic resonance signal of the first receiving channel in the third frequency band FB8, is output from the diplexer 88-2. In this way, the magnetic resonance signals of the second and first receiving channels are selected as magnetic resonance signals of magnetic resonance signals of the first and second processing channels. In addition, it is general to set the third frequency band to be lower than the first frequency band. The magnetic resonance signal frequency-converted into a signal included in the third frequency band is converted into a signal included in a lower frequency band to be then A/D converted or directly A/D converted by the receiving unit 9. Here, the third frequency band may be equal to the first frequency band. In this case, the selection circuit 8 serves only to select a channel, and a frequency conversion, which is a pre-process for the A/D conversion, is performed by the receiving unit 9. In addition, the third frequency band may be higher than the first frequency band.

Figure 8:
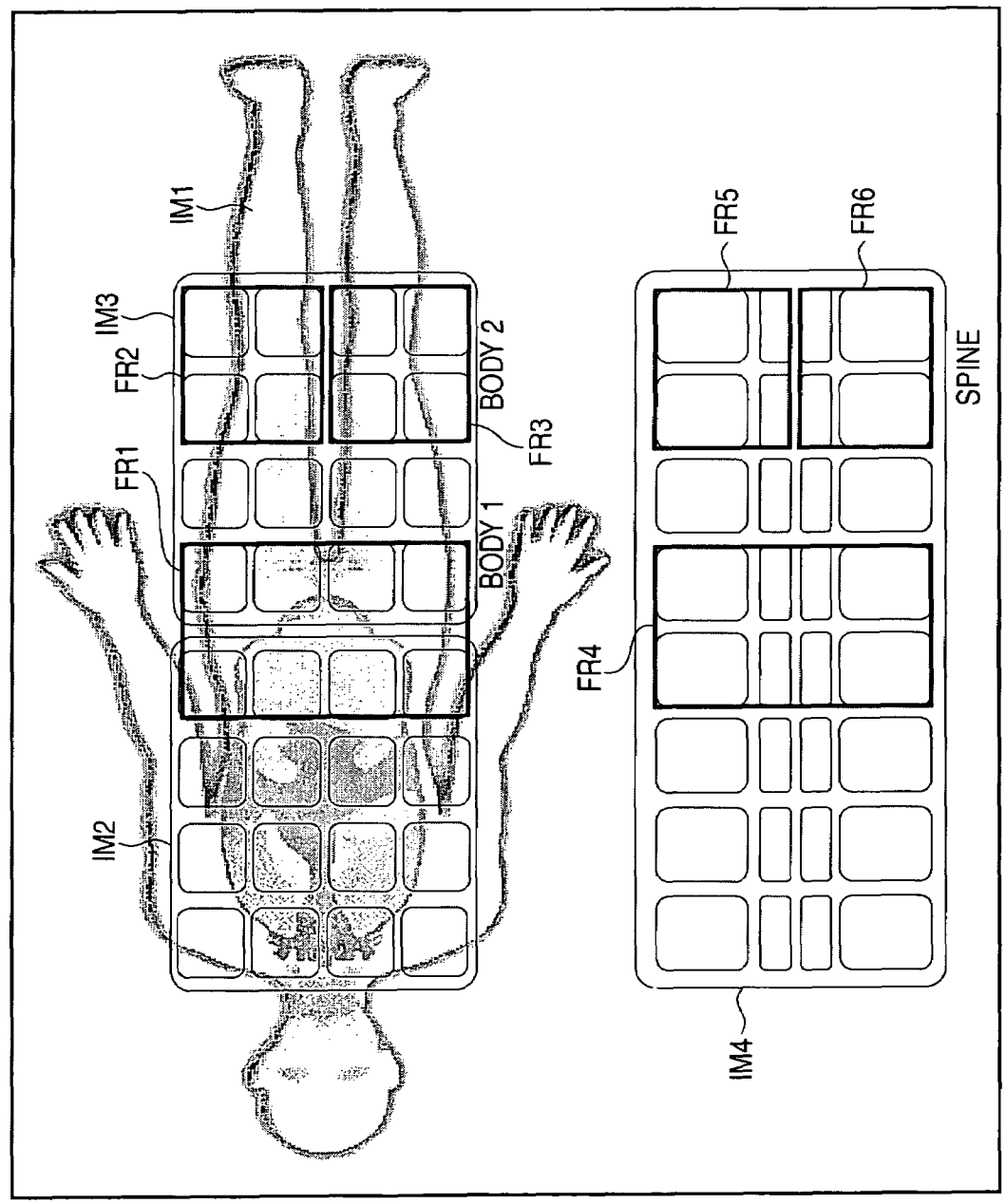
FIG. 8 is a view illustrating an example of an image through which a user can select a coil element to be selected.

FIG. 8 is a view illustrating an example of an image through which a user can select a coil element to be selected. The control unit 17 displays an image shown in FIG. 8 on the display unit 15 so as to receive an instruction of a user with respect to a coil element to be selected.

The image shown in FIG. 8 includes images IM1 to IM4 and frames FR1 to FR6. The image IM1 is a view showing a human body lying on the top plate 41 as seen from above. The IM1 is a model image or an image obtained by a pre-scan process. Further, a lateral image of the human body may be displayed together with the image seen from above. On upper and lower surfaces of the lateral image of the human body, a line showing elements in the Z direction is displayed.

The images IM2 and IM3 overlap the image IM1 with respect to an RF coil unit disposed at the abdomen side of the patient's body P. The image IM4 is related to an RF coil unit disposed on the top plate 41, that is, the RF coil unit disposed at the back side of the patient's body P. Here, the image IM4 is shown in parallel to the images IM1, IM2, and IM3; however, the image IM4 may be disposed to overlap an image of the human body lying on the top plate 41 as seen from below.

Each of the images IM2, IM3, and IM4 has an external frame and an internal frame. The internal frame shows the location of each coil element and the external frame shows an RF unit to which each coil element belongs. FIG. 8 illustrates that a plurality (here, two) of RF coil units 6c shown in FIG. 1 is disposed at the abdomen side of the patient's body P and each of the RF coil units 6c include coil elements disposed in a matrix of 4 rows×4 columns. Furthermore, FIG. 8 illustrates that the RF coil unit 6b shown in FIG. 1 is disposed at the back side of the patient's body P and the RF coil unit 6b include coil elements disposed in a matrix of 4 rows×8 columns.

As shown in FIG. 8, an even number of coil elements included in each of the RF coil units 6b and 6c are disposed in the direction of a body width (x axis) and the direction of a body axis (z axis). The number of coil elements of the RF coil unit 6c in the direction of the body width (x axis) is equal to that of the RF coil unit 6b, and the number of coil elements of the RF coil unit 6c in the direction of the body axis (z axis) is smaller than that of the RF coil unit 6b (4<8).

Further, as shown in FIG. 8, the sizes of coil elements located in the middle line of the RF coil unit 6b are smaller than the size of coil elements located near both edges of the RF coil unit 6b.

The frames FR1 to FR6 are used by a user and surround frames indicating designated coil elements, respectively. The control unit 17 arbitrarily sets frames, such as the frames FR1 to FR6, in response to a user's manipulation on the input unit 16. In addition, the control unit 17 determines coil elements, which are located inside the frame set as described above, as objects to be selected by the selection circuit 8.

As such, according to the present embodiment, one to n channel magnetic resonance signals, which are arbitrarily designated by a user, among magnetic resonance signals corresponding to m or less receiving channels can be selected as magnetic resonance signals of processing channels. In addition, according to the present embodiment, it is desirable that processing systems corresponding to the number of receiving channels and the number of processing channels be provided. Therefore, even if the number of combinations of receiving channels and processing channels increases, the increasing amount in a configuration of the selection circuit 8 is smaller than that in a case where a matrix switch is used.

According to the present embodiment, depending on which frequency band is assigned for a receiving channel to be selected, it can be arbitrarily changed which magnetic resonance signal is input to which input channel of the receiving unit 9. In the case in which matrix switches are connected in multiple stages, an input channel to which a magnetic resonance signal of a predetermined receiving channel can be input is limited to some of the input channels of the receiving unit 9. For this reason, according to the present embodiment, the flexibility of an operation is better than in the case in which the matrix switches are connected in multiple stages. For example, in the present embodiment, when magnetic resonance signals of receiving channels (i channels), where the number of the receiving channels is smaller than the number of input channels of the receiving unit 9, are to be selected, the magnetic resonance signals corresponding to the i channels can be input to the receiving unit 9 such that the magnetic resonance signals always correspond to the first and i-th input channels, respectively. In this case, an image reconstruction process may be efficiently performed. That is, when data indicated by magnetic resonance signals of a plurality of channels collected at double speed is phase-expanded, it is not necessary to change the sequence of the data as long as the data is arranged at consecutive channels. In contrast, in the case in which the data is obtained from channels apart from each other, a process of changing the sequence of the data is required, and as a result, the processing efficiency is lowered as compared with the present embodiment. Further, since the storage unit 14 needs a large capacity and the reconstruction unit 13 needs a capacity to perform a high speed data transmission in order to change the sequence of the data, the present embodiment is advantageous over the related art.

The present embodiment may be modified in various ways to be described below.

For example, when a receiving channel to be selected is only one, a magnetic resonance signal corresponding to the one receiving channel may be input to the synthesizer 82 without being frequency-converted.

In addition, magnetic resonance signals of receiving channels, which are not to be selected, may be frequency-converted into signals included in a frequency band narrower than the second frequency band. Alternatively, the magnetic resonance signals of the receiving channels, which are not to be selected, may be input to the synthesizer 82 without being frequency-converted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a reception unit having a plurality of processing systems each processing a magnetic resonance signal; and
   a selection unit that selectively outputs a plurality of magnetic resonance signals each output from a plurality of reception coils to said plurality of processing systems, wherein said selection unit includes:
   a first converter that converts some of the magnetic resonance signals, to be processed, corresponding to the plurality of reception coils into signals corresponding to a plurality of effective channels set within a first frequency band and converts magnetic resonance signals corresponding to other reception coils into signals corresponding to channels set within a second frequency band different from the first frequency band;
   a synthesizer that synthesizes the channel-converted signals;
   an extractor that extracts a signal included in the first frequency band from the synthesized signals; and
   a divider that divides the extracted signal into magnetic resonance signals corresponding to the plurality of effective channels to output the magnetic resonance signals to said plurality of processing systems.

2. The magnetic resonance imaging apparatus according to claim 1, wherein the first converter includes:
   a first generator that generates a plurality of first local signals corresponding to a plurality of input channels and can individually convert frequencies of the plurality of first local signals;
   a mixer that mixes each of the plurality of first local signals corresponding to the input channels with a signal of each of the plurality of input channels; and
   a controller that controls the first generator such that a frequency of the first local signal corresponding to the input channel to be processed becomes a frequency corresponding to each of the plurality of effective channels and frequencies of the first local signals corresponding to the input channels not to be processed become frequencies corresponding to channels set within the second frequency band.

3. The magnetic resonance imaging apparatus according to claim 2,
   wherein the extraction unit filters, out of the synthesized signals, signals of channels set within the second frequency band, unnecessary image signals generated due to the conversion performed by the first converter, and the first local signals.

4. The magnetic resonance imaging apparatus according to claim 1,
   wherein the divider includes:
   a dividing unit that divides the extracted signal into a plurality of signals; and
   an extraction unit that extracts a frequency band of each of the plurality of effective channels from the plurality of divided signals.

5. The magnetic resonance imaging apparatus according to claim 1, further comprising:
   a second converter that converts the plurality of magnetic resonance signals divided by the divider into signals included in a third frequency band, respectively.

6. The magnetic resonance imaging apparatus according to claim 5,
   wherein the second converter includes:
   a second generator that generates a plurality of second local signals corresponding to the plurality of effective channels and can individually convert frequencies of the plurality of second local signals; and
   a mixer that mixes each of the plurality of second local signals corresponding to the effective channels with each of the signals, corresponding to the plurality of effective channels, divided by the divider.

7. The magnetic resonance imaging apparatus according to claim 6,
   wherein the second converter further includes an extraction unit that extracts the third frequency band from the plurality of signals output from the mixer.

8. The magnetic resonance imaging apparatus according to claim 1, further comprising:

first and second coil units each having a plurality of coil elements, each of the plurality of coil elements outputting a magnetic resonance signal corresponding to one channel, wherein the first and second coil units are disposed at the back and abdomen sides of a patient's body, respectively, and the number of coil elements included in the second coil unit is smaller than the number of coil elements included in the first coil unit.

9. The magnetic resonance imaging apparatus according to claim 8, wherein, in each of the first and second coil units, the coil elements are disposed in a matrix and in a first direction corresponding to the body width direction of the patient's body and a second direction corresponding to the body axis direction of the patient's body, and the number of coil elements which are included in the second coil unit and are disposed in the first direction is set to be smaller than the number of coil elements which are included in the first coil unit and are disposed in the first direction, and the number of coil elements which are included in the second coil unit and are disposed in the second direction is set to be equal to the number of coil elements which are included in the first coil unit and are disposed in the second direction.

10. The magnetic resonance imaging apparatus according to claim 1, further comprising:

a coil unit having a plurality of coil elements each outputting a magnetic resonance signal corresponding to one channel, wherein at least some of the plurality of coil elements is disposed along the first direction corresponding to the body width direction of a patient's body, and the sizes of the coil elements located at a middle portion of the coil unit in the first direction are smaller than the sizes of the coil elements located near both edges of the coil unit in the first direction.

11. The magnetic resonance imaging apparatus according to claim 1, further comprising:

a coil unit having a plurality of coil elements each outputting a magnetic resonance signal corresponding to one channel; and a user interface unit that receives a designation with respect to coil elements, which output some of the magnetic resonance signals to be processed, on an image showing an arrayed state of the coil elements in the coil unit and a positional relationship between a patient's body and the coil unit.

12. A magnetic resonance imaging apparatus comprising:

a first converter that converts some of a plurality of magnetic resonance signals, to be processed, into signals corresponding to a plurality of effective channels set within a first frequency band and converts other magnetic resonance signals into signals corresponding to channels set within a second frequency band different from the first frequency band, each of the magnetic resonance signals being output from a plurality of reception coils;

a synthesizer that synthesizes the channel-converted signals; and a reconstruction unit that reconstructs an image on the basis of only a signal, included in the first frequency band, of the synthesized signals.

13. A signal selection method in a magnetic resonance imaging apparatus comprising:

converting some of plural magnetic resonance signals, to be processed, corresponding to a plurality of channels into signals corresponding to a plurality of effective channels set within a first frequency band and converting magnetic resonance signals corresponding to other channels into signals corresponding to channels set within a second frequency band different from the first frequency band so as to selectively output magnetic resonance signals corresponding to a plurality of channels each output from a plurality of reception coils to a plurality of processing systems included in a reception unit to process magnetic response signals;

synthesizing the channel-converted signals;

extracting a signal included in the first frequency band from the synthesized signals; and dividing the extracted signal into magnetic resonance signals corresponding to the plurality of effective channels to output the magnetic resonance signals to said plurality of processing systems.

14. The signal selection method according to claim 13, wherein the channel conversion process includes:

generating a plurality of first local signals corresponding to a plurality of input channels;

mixing each of the plurality of first local signals corresponding to the input channels with a signal of each of the plurality of input channels; and controlling such that a frequency of the first local signal corresponding to the effective channel to be processed becomes a frequency corresponding to each of the plurality of input channels and frequencies of the first local signals corresponding to the input channels not to be processed become frequencies corresponding to channels set within the second frequency band.

15. The signal selection method according to claim 14, wherein, in the extraction process, signals of channels set within the second frequency band, unnecessary image signals generated due to the conversion performed by the first converter, and the first local signals are filtered out of the synthesized signals.

16. The signal selection method according to claim 13, wherein the division process includes:

dividing the extracted signal into a plurality of signals; and extracting a frequency band of each of the plurality of effective channels from the plurality of divided signals.

17. The signal selection method according to claim 13, further comprising:

converting the plurality of divided magnetic resonance signals into signals included in a third frequency band, respectively.

18. The signal selection method according to claim 17, wherein the process of converting the plurality of divided magnetic resonance signals into the signals included in a third frequency band includes:

generating a plurality of second local signals corresponding to the plurality of effective channels; and mixing each of the plurality of second local signals corresponding to the effective channels with each of the divided signals corresponding to the plurality of effective channels.

19. The signal selection method according to claim 18, wherein the process of converting the plurality of divided magnetic resonance signals into the signals included in a third frequency band further includes extracting the third frequency band from the plurality of mixed signals.

20. A magnetic resonance imaging method comprising:

converting some of a plurality of magnetic resonance signals, to be processed, into signals corresponding to a plurality of effective channels set within a first frequency band and converting other magnetic resonance signals into signals corresponding to channels set within a second frequency band different from the first frequency band, each of the magnetic resonance signals being output from a plurality of reception coils;

synthesizing the channel-converted signals; and reconstructing an image on the basis of only a signal, included in the first frequency band, of the synthesized signals.

21. A magnetic resonance imaging system comprising:

a plurality m of MRI RF signal reception coils providing a corresponding plurality m of RF coil outputs, m being an integer;

a plurality n of MRI RF signal receiver processing circuits, n being an integer less than m;

an RF frequency domain switch disposed between said plurality m of MRI RF signal reception coil outputs and said plurality n of MRI RF signal receiver processing circuits, said switch including m input frequency converters coupled to respective outputs of said m MRI RF signal reception coils and also including n output frequency converters coupled to respective ones of said n MRI RF signal receiver processing circuits;

said switch also including signal combining circuits, frequency selective filters and signal dividing circuits interposed between said input and output frequency converters;

said switch further including control inputs to said input and output frequency converters, said control inputs being coupled to a switch controller which controls said frequency converters with respect to said frequency selective filters so as to pass n selected outputs of said m RF coils to said n receiver processing circuits; and MRI signal processing means coupled to receive said n selected outputs and to output MR image signals corresponding thereto.

22. A magnetic resonance imaging method for use in an MRI system having a plurality m of MRI RF signal reception coils producing a corresponding plurality m of RF coil output signals, m being an integer, and a plurality n of MRI RF signal receiver processing circuits, n being an integer less than m, said method comprising:

frequency converting said m RF coil output signals onto respectively corresponding different frequency RF signal carriers;

frequency selectively filtering out some of said m frequency converted RF coil outputs carried by said different frequency RF carriers to produce n frequency-converted RF coil outputs carried by different frequency RF carriers; and performing MRI processing of said n selected RF coil outputs.

* * * * *